(12) United States Patent
Zhang

(10) Patent No.: US 9,905,797 B2
(45) Date of Patent: Feb. 27, 2018

(54) OLED DISPLAY DEVICE AND FABRICATION METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Yuting Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 0 days.

(21) Appl. No.: 14/429,532

(22) PCT Filed: Jul. 30, 2014

(86) PCT No.: PCT/CN2014/083275
§ 371 (c)(1),
(2) Date: Mar. 19, 2015

(87) PCT Pub. No.: WO2015/058571
PCT Pub. Date: Apr. 30, 2015

(65) Prior Publication Data
US 2016/0043343 A1 Feb. 11, 2016

(30) Foreign Application Priority Data
Oct. 25, 2013 (CN) .......................... 2013 1 0513040

(51) Int. Cl.
*H01L 51/52* (2006.01)
*H01L 51/56* (2006.01)
*H01L 27/32* (2006.01)

(52) U.S. Cl.
CPC ...... *H01L 51/5246* (2013.01); *H01L 27/3244* (2013.01); *H01L 27/3253* (2013.01);
(Continued)

(58) Field of Classification Search
CPC ............. H01L 51/5246; H01L 51/5212; H01L 51/5228; H01L 51/524; H01L 27/322;
(Continued)

(56) References Cited

U.S. PATENT DOCUMENTS 8,604,332 B2 * 12/2013 Veerasamy ............ B82Y 10/00
136/243
8,944,875 B2 * 2/2015 Kim ...................... H01L 51/003
445/24
(Continued)

FOREIGN PATENT DOCUMENTS

CN 1560689 A 1/2005
CN 1602123 A 3/2005
(Continued)

OTHER PUBLICATIONS

Second Chinese Office Acton dated Dec. 29, 2015; Appln. No. 201310513040.1.
(Continued)

*Primary Examiner* — Savitr Mulpuri
(74) *Attorney, Agent, or Firm* — Ladas & Parry LLP

(57) ABSTRACT

An OLED display device and a fabrication method thereof are provided. The OLED display device, includes: an array substrate and a package substrate cell-assembled, wherein, the array substrate includes a first base substrate, an anode layer, a cathode layer and an electroluminescent layer disposed between the anode layer and the cathode layer, the anode layer or the cathode layer is disposed as an upper most layer of the array substrate; the package substrate includes a second base substrate and a graphene layer, the graphene
(Continued)

layer is disposed as an upper most layer of the package substrate; a conductive filler is provided between the array substrate and package substrate, the graphene layer is electrically connected with the anode layer or the cathode layer disposed as the upper most layer of the array substrate via the conductive filler.

17 Claims, 3 Drawing Sheets

(52) U.S. Cl.
CPC ........ *H01L 27/3279* (2013.01); *H01L 51/524* (2013.01); *H01L 51/5212* (2013.01); *H01L 51/5228* (2013.01); *H01L 51/5253* (2013.01); *H01L 51/56* (2013.01); *H01L 27/322* (2013.01); *H01L 2227/323* (2013.01); *H01L 2251/301* (2013.01)

(58) Field of Classification Search
CPC ............. H01L 27/3244; H01L 27/3253; H01L 51/5253; H01L 51/56; H01L 2227/323; H01L 2251/301; H01L 27/3279
IPC ........................................................ H01L 51/52
See application file for complete search history.

(56) References Cited

U.S. PATENT DOCUMENTS

| | | | | |
|---|---|---|---|---|
| 9,082,523 | B2* | 7/2015 | Ozyilmaz | ................. H01B 1/04 |
| 2001/0043046 | A1 | 11/2001 | Fukunaga | |
| 2012/0282419 | A1* | 11/2012 | Ahn | ....................... B82Y 30/00 428/34.8 |
| 2013/0210218 | A1* | 8/2013 | Accardi | ............ H01L 21/02527 438/478 |
| 2014/0034899 | A1* | 2/2014 | Ahn | ........................ H01L 29/06 257/9 |
| 2014/0042397 | A1* | 2/2014 | Cho | .................... H01L 51/0001 257/40 |
| 2014/0051192 | A1* | 2/2014 | Lee | ......................... H01L 51/56 438/26 |
| 2014/0141600 | A1* | 5/2014 | Lee | .................... H01L 21/0242 438/479 |
| 2014/0145162 | A1* | 5/2014 | Lin | ....................... H01L 27/323 257/40 |
| 2014/0167012 | A1 | 6/2014 | Sun et al. | |
| 2014/0183458 | A1* | 7/2014 | Lee | ......................... H01L 51/56 257/40 |
| 2014/0256206 | A1* | 9/2014 | Kim | ...................... H01L 51/003 445/24 |
| 2015/0029607 | A1* | 1/2015 | Lee | .................... G02F 1/133516 359/891 |
| 2015/0171375 | A1* | 6/2015 | Setz | .................... H01L 51/5275 257/40 |
| 2015/0236303 | A1* | 8/2015 | Cheng | ................. H01L 51/5275 257/40 |
| 2016/0254454 | A1* | 9/2016 | Cheng | .................... H01L 27/32 257/40 |
| 2016/0276619 | A1* | 9/2016 | Cheng | .................... H01L 51/56 |

FOREIGN PATENT DOCUMENTS

| | | |
|---|---|---|
| CN | 1848475 A | 10/2006 |
| CN | 1928645 A | 3/2007 |
| CN | 101136376 A | 3/2008 |
| CN | 101404322 A | 4/2009 |
| CN | 101442105 A | 5/2009 |
| CN | 102005540 A | 4/2011 |
| CN | 102056361 A | 5/2011 |
| CN | 102157687 A | 8/2011 |
| CN | 102169963 A | 8/2011 |
| CN | 102709310 A | 10/2012 |
| CN | 102983290 A | 3/2013 |
| CN | 103022378 A | 4/2013 |
| CN | 103531717 A | 1/2014 |
| JP | 2003-092192 A | 3/2003 |

OTHER PUBLICATIONS

International Search Report dated Oct. 22, 2014; PCT/CN2014/083275.
Written Opinion of the International Searching Authority dated Oct. 22, 2014; PCT/CN2014/083275.
First Chinese Office Action dated Jun. 1, 2015; Appln. No. 201310513040.1.
Third Chinese Office Action dated Apr. 26, 2016; Appln. No. 201310513040.1.

* cited by examiner

OLED DISPLAY DEVICE AND FABRICATION METHOD THEREOF

TECHNICAL FIELD

Embodiments of the present disclosure relate to an OLED display device and a fabrication method thereof.

BACKGROUND

An Organic Light-Emitting Diode (OLED) device, due to advantages such as self-luminescence, all solid state, wide viewing angle, and quick response, has a tremendous application prospect in flat panel display products, and is even considered as a new generation of flat panel display product following a Liquid Crystal Display (LCD) and a Plasma Display Panel (PDP).

A basic structure of the OLED display device is illustrated with a color OLED display device as an example. The color OLED display device includes a package substrate 910 and an array substrate 920 assembled to form a cell, as shown in FIG. 1, the package substrate 910 includes a second base substrate 91, as well as a black matrix film layer 92 and a color film layer 93 disposed on the second base substrate 91. The color film layer 93 includes pattern units of three different colors: R (red), G (green) and B (blue). The array substrate 920 includes a first base substrate 94 as well as an anode layer 95, an electroluminescent layer 96 and a cathode layer 97 disposed on the first base substrate 94. A filler 98 is filled between the package substrate 910 and the array substrate 920, so as to form the display device. The conventional anode layer 95 and the cathode layer 97 are both made of ITO, with a large charge transfer resistance, which impacts a display effect.

SUMMARY OF THE PRESENT DISCLOSURE

An embodiment of the present disclosure provides an OLED display device, comprising: an array substrate and a package substrate cell-assembled, wherein, the array substrate includes a first base substrate, an anode layer, a cathode layer and an electroluminescent layer disposed between the anode layer and the cathode layer, the anode layer or the cathode layer is disposed as an upper most layer of the array substrate; the package substrate includes a second base substrate and a graphene layer, the graphene layer is disposed as an upper most layer of the package substrate; a conductive filler is provided between the array substrate and package substrate, the graphene layer is electrically connected with the anode layer or the cathode layer disposed as the upper most layer of the array substrate via the conductive filler.

An embodiment of the present disclosure provides a fabrication method of an OLED display device, comprising: forming an array substrate; forming a package substrate; and cell-assembling the array substrate and the package substrate; wherein the forming an array substrate comprises forming an anode layer or a cathode layer on a first base substrate, the anode layer or the cathode layer is disposed as an upper most layer of the array substrate; the forming a package substrate comprises forming a graphene layer on a second base substrate, the graphene layer is disposed as an upper most layer of the package substrate; the cell-assembling the array substrate and the package substrate comprises cell-assembling the array substrate and the package substrate by a conductive filler provided between the array substrate and the package substrate, so that the graphene layer is electrically connected with the anode layer or the cathode layer disposed as the upper most layer of the array substrate via the conductive filler.

BRIEF DESCRIPTION OF THE DRAWINGS

In order to clearly illustrate the technical solution of the embodiments of the present disclosure, the drawings of the embodiments and related art will be briefly described in the following; it is obvious that the described drawings are only related to some embodiments of the present disclosure and thus are not limitative of the present disclosure.

DESCRIPTION OF THE EMBODIMENTS

Figure 1:
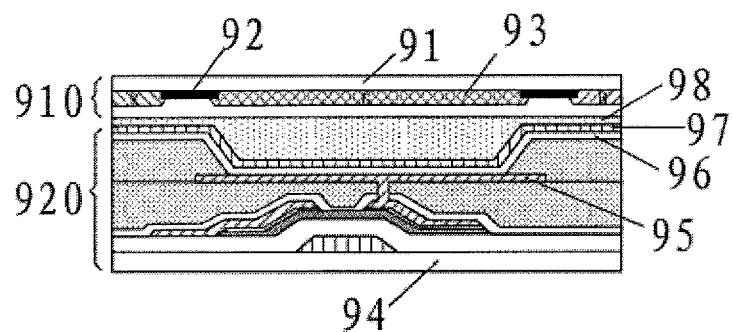
FIG. 1 is a schematic diagram of an OLED display device in related art.

The technical solutions of the embodiments will be described in a clearly and fully understandable way in connection with the accompanying drawings hereinafter. It is obvious that the described embodiments are just part of but not all of the embodiments of the present disclosure. Based on the described embodiments herein, those skilled in the art can obtain other embodiment(s), without any inventive work, which should be within the scope of the present disclosure.

The embodiments of the present disclosure provide an OLED display device and a fabrication method thereof. A graphene layer is disposed as the upper most layer of a package substrate of the OLED display device, and is electrically connected with an anode layer or a cathode layer disposed on the uppermost layer of an array substrate by a conductive filler, which can further reduce a resistance of the anode layer or the cathode layer on the array substrate, thus improving display effect.

An embodiment of the present disclosure provides an OLED display device, comprising: an array substrate and a package substrate cell-assembled, the array substrate including a first base substrate, and an anode layer and a cathode layer disposed on the first base substrate, with an electroluminescent layer interposed therebetween, wherein, the anode layer or the cathode layer is disposed as an upper most layer of the array substrate; the package substrate including a second base substrate and a graphene layer, wherein, the graphene layer is disposed as an upper most layer of the package substrate; a conductive filler is filled between the array substrate and the package substrate, so that the graphene layer is electrically connected with the anode layer or the cathode layer disposed as the upper most layer of the array substrate via the conductive filler.

In the OLED display device provided by the embodiment of the present disclosure, the cathode layer and the anode layer are disposed on the first base substrate, and an organic light-emitting material layer is disposed between the cathode layer and the anode layer. When the cathode layer and the anode layer are energized simultaneously, due to migration of charges, the organic light-emitting material is excited to emit light to display. In some examples, for example, a hole transport layer may be further added between the organic light-emitting material layer and the anode, so as to adjust an injection rate and injection amount of hole. An electron transport layer may also be added between the organic light-emitting material layer and the cathode, so as to adjust an injection rate and injection amount of electron. Since specific structures of the hole transport layer and the electron transport layer are irrelevant to inventive points of the present disclosure, detail description thereof will be omitted herein. The embodiment of the present disclosure is illustrated by an example wherein the anode of the array substrate is located below the organic light-emitting material layer while the cathode is located above the organic light-emitting material layer. Here, the terms "above", "upper", "below" and "lower" are based on a fabricating sequence of layers on the same base substrate, layer previously formed located below or lower, and the layer later formed located above or upper.

It should be noted that the array substrate has the anode layer and the cathode layer disposed thereon and the electroluminescent layer disposed between the anode layer and the cathode layer, wherein the anode layer and the cathode layer are two opposite layers, which may be that the anode layer is formed on a side adjacent to the first base substrate, and the cathode layer is formed on a side far away from the first base substrate; or may be that the cathode layer is formed on the side adjacent to the first base substrate, and the anode layer is formed on the side far away from the first base substrate. In the embodiment of the present disclosure, it will be illustrated in detail with the anode layer being formed on the side adjacent to the first base substrate, and the cathode layer being formed on the side far away from the first base substrate as an example. The OLED display device according to the embodiment of the present disclosure, based on the color of emitted light, may implement monochrome display, and also may implement color display by providing a color film layer. In the embodiment of the present disclosure, it will be illustrated in detail with the package substrate of the OLED display device having a color film layer disposed thereon as an example. In addition, both the base substrates included by the array substrate and the package substrate may be transparent base substrates, or only the substrate on a light outgoing side is a transparent substrate. In the embodiment of the present disclosure, as an example, the package substrate is illustrated to be a transparent substrate.

Figure 2:
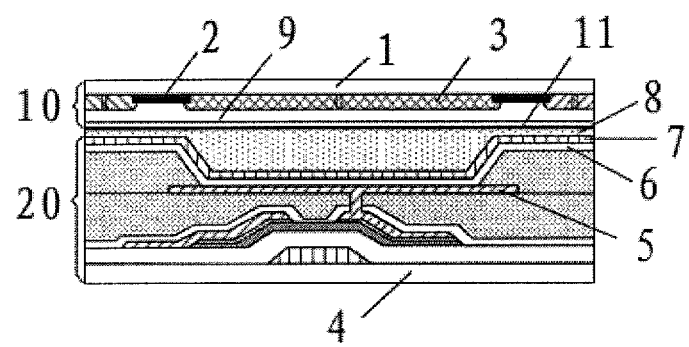
FIG. 2 is a schematic diagram of an OLED display device provided by an embodiment of the present disclosure.
Figure 3:
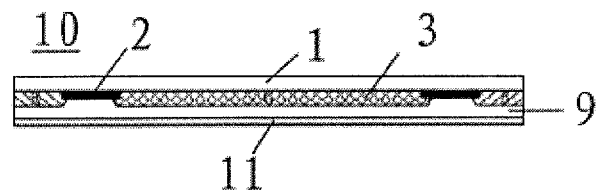
FIG. 3 is a schematic diagram of a package substrate in the OLED display device of FIG. 2.

As shown in FIG. 2, the embodiment of the present disclosure provides an OLED display device comprising an array substrate 20 and a package substrate 10 cell-assembled, wherein the array substrate 20 includes a first base substrate 4, and an anode layer 5, a cathode layer 7 and an electroluminescent layer 6 disposed between the anode layer 5 and the cathode layer 7. The anode layer 5, the cathode layer 7 and the electroluminescent layer 6 are disposed on the first base substrate 4. The package substrate 10 includes a second base substrate 1, and a black matrix film layer 2 and a color film layer 3 disposed on the second base substrate 1. The color film layer 3 includes pattern units of three different colors: R (red), G (green) and B (blue). The package substrate 10, as shown in FIG. 3, further includes a graphene layer 11 disposed on the second base substrate 1. And, the array substrate 20 and the package substrate 10 are cell-assembled by a conductive filler 8 therebetween, and then the anode layer or the cathode layer disposed as the upper most layer of the array substrate is electrically connected with the graphene layer 11 via the conductive filler 8.

Optionally, the package substrate further includes a protective layer 9 located between the second base substrate 1 and the graphene layer 11.

In an example, a metal layer, for example, a silver metal layer, etc., is formed on the protective layer 9 of the package substrate, and then a Indium tin oxide (ITO) layer is deposited on the metal layer, wherein the ITO layer is in contact with the cathode layer or the anode layer disposed as the upper most layer of the array substrate by the conductive filler 8. Such structure improves the resistivity of the cathode layer or the anode layer disposed as the upper most layer of the array substrate.

Graphene is a material having single-layer-structure consisting of carbon atoms, which has advantages of high transparency, low resistivity, and fast electron mobility as compared with other conductive metal materials. However, grapheme, due to its unique characteristics, can be hardly directly formed on a package substrate by a process similar to that for forming a metal layer on the package substrate. In an embodiment of the present disclosure, a graphene layer is firstly formed on a third base substrate, and then the graphene layer is transferred to a surface of a package substrate, so as to arrange the graphene layer on the package substrate. In the embodiment of the present disclosure, the cathode or the anode electrically connected with the graphene layer has small transfer resistance and good voltage uniformity, and can further improve the display effect. It should be noted that, the graphene layer may be single-layer graphene, and may also be multi-layer graphene, and in the embodiment of the present disclosure, it is illustrated in detail with the grapheme layer being multi-layer graphene as an example.

In the OLED display device provided by an embodiment of the present disclosure, the anode layer or the cathode layer is disposed as the upper most layer of the array substrate of the display device, the graphene layer is disposed on the upper most layer of the package substrate, and the array substrate and the package substrate are cell-assembled by the conductive filler. Therefore, the graphene layer of the package substrate is electrically connected with the cathode layer or the anode layer disposed as the upper most layer of the array substrate via the conductive filler, which can further reduce the resistance of the cathode layer or the anode layer.

It should be noted that the protective layer 9 is mainly used for flattening the thin films or the patterns on the second base substrate. As shown in FIG. 3, when the second base substrate 1 has the black matrix film layer 2 and the color film layer 3 formed thereon, the upper surface thereof is uneven, and the protective layer 9 can be disposed to flatten the surface of the package substrate, which is favorable for improving the display effect. For example, as shown in FIG. 3, the package substrate 10 further has the protective layer 9 disposed between the second base substrate 1 and the graphene layer 11. Of course, without the color film layer and the black matrix film layer, the second base substrate can also have the protective layer disposed thereon.

Figure 4:
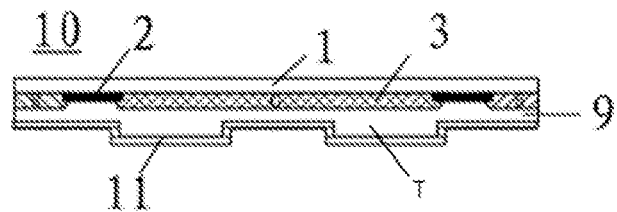
FIG. 4 a schematic diagram of a package substrate of an OLED display device provided by an embodiment of the present disclosure, showing a patterned protective layer on the package substrate.

Further, the protective layer has a protective pattern. For example, as shown in FIG. 4, an upper surface of the protective layer 9 has a protective pattern formed by a plurality of projecting portions T disposed thereon. Of course, the protective pattern of the protective layer can further be other thin film patterns. The embodiment of the present disclosure is illustrated in FIG. 4 as an example. In addition, the patterned protective layer can be configured for adjusting the transmittance and refractivity of the OLED light, thus reducing scattering and improves contrast.

Optionally, the package substrate 10 further includes a spacer layer located between the protective layer and the graphene layer, the spacer layer including spacer patterns.

Figure 5:
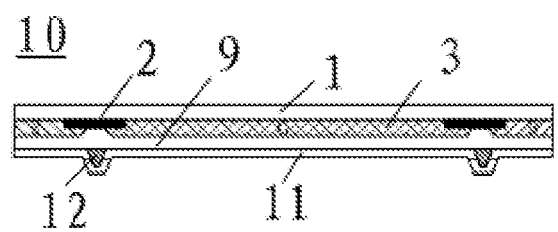
FIG. 5 is a schematic diagram of a package substrate of an OLED display device provided by an embodiment of the present disclosure.
Figure 6:
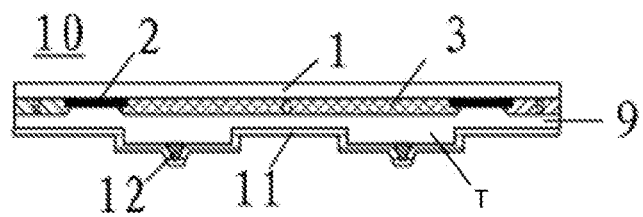
FIG. 6 is a schematic diagram of a package substrate of an OLED display device provided by an embodiment of the present disclosure.

For example, as shown in FIG. 5, the package substrate 10 further has a spacer layer disposed between the protective layer 9 and the graphene layer 11, the spacer layer including a plurality of spacers 12. Of course, as shown in FIG. 6, the spacer 12 may also be disposed between a projecting portion of the protective layer 9 and the graphene layer 11. It should be noted that, the spacer may be a pattern of any other shape, for example, it may also be of a rectangular shape, etc. The embodiment of the present disclosure is illustrated in detail in FIGS. 5 and 6 as examples. The spacer can be configured for alleviating pressure on the display screen.

Figure 9:
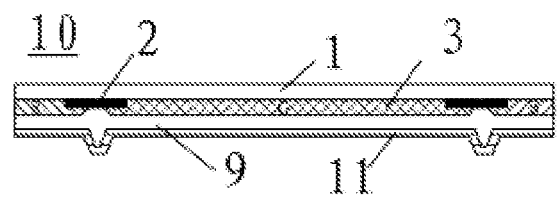
FIG. 9 is a schematic diagram of a package substrate of an OLED display device provided by an embodiment of the present disclosure.

Optionally, the spacer layer and the protective layer are made of the same material. Further, the spacer layer and the protective layer are formed at one step. For example, as shown in FIG. 9, the spacer layer and the protective layer of the same material can be formed at one step by one patterning process, so that the spacer layer and the protective layer are formed as a whole, thus avoiding poor contact and facilitating fabrication. Of course, the spacer layer and the protective layer can also be made of different materials and formed by respectively patterning processes.

An embodiment of the present disclosure provides a fabrication method of an OLED display device, comprising: forming an array substrate; forming a package substrate; and cell-assembling the array substrate and the package substrate; wherein the forming an array substrate, for example, includes: forming an anode layer or a cathode layer on a first base substrate; the forming a package substrate, for example, includes: forming a graphene layer on a second base substrate; the cell-assembling the array substrate and the package substrate, for example, includes: cell-assembling the array substrate and the package substrate by a conductive filler, so that the graphene layer is electrically connected with the anode layer or the cathode layer disposed as an upper most layer of the array substrate via the conductive filler.

It should be noted that, the array substrate includes the cathode layer and the anode layer, and a electroluminescent layer is disposed between the anode layer and the cathode layer, and the anode layer and the cathode layer may be disposed opposite to each other. In the embodiment of the present disclosure, the anode layer or the cathode layer is formed on the uppermost of the array substrate, i.e., the anode layer or the cathode layer is located as the upper most layer of the array substrate. The forming a package substrate, for example, includes: forming the graphene layer on the second base substrate, the graphene layer being located as the upper most layer of the package substrate.

It should be noted that, an electron injection layer and an electron transport layer can be further disposed between the electroluminescent layer and the cathode layer, and a hole injection layer and a hole transport layer can be further disposed between the electroluminescent layer and the anode layer.

It should be noted that graphene is a material having single-layer-structure consisting of carbon atoms, which is characterized by high transparency, low resistivity, and fast electron mobility as compared with other conductive metal materials.

Optionally, the forming a graphene layer on the second base substrate, for example, includes:

Step 101: forming a nickel layer with a thickness of 200-500 nm on a third base substrate.

The third base substrate may be a base substrate different from the first base substrate and the second base substrate and for forming other thin film or layer structure. For example, a nickel layer with a thickness of 200-300 nm is formed on the third base substrate.

Step 102: heating the third base substrate having the nickel layer obtained in the above-described step 101 in a mixed gas stream of methane, hydrogen and argon at 900-1,200° C., and then rapidly cooling the same to a room temperature.

For example, the third base substrate having the nickel layer obtained in the above-described step 101 is heated in a mixed gas stream of methane, hydrogen and argon at 1,000° C., and then rapidly cooled to a room temperature.

Step 103: etching off nickel with a solvent, so that a graphene thin film floats on a surface of a solution, thus forming the graphene layer.

It should be noted that, there are a plurality of methods for forming the graphene layer. For example, the graphene layer can be formed by a physical method, and the graphene layer may also be formed by a chemical method. In the embodiment of the present disclosure, the graphene thin film formed by a chemical vapor deposition method is illustrated in detail and only given as an example.

Step 104: transferring the graphene layer onto an upper surface of the second base substrate.

It should be noted that forming the graphene layer onto an upper surface of the second base substrate can be implemented by attaching the graphene thin film onto the upper surface of the second base substrate by a transparent glue, for example.

Optionally, before forming the graphene layer on the second base substrate, the forming a package substrate further includes: forming a protective layer on the second base substrate. The protective layer may be used for flattening the surface of the substrate, so as to improve the display effect. Of course, if the display device is to implement a color display, a color film layer and so on can be further disposed on the package substrate. Fabrication steps of the color film layer may be correspondingly performed according to a specific display device.

Optionally, before forming the graphene layer on the second base substrate, and after forming the protective layer on the second base substrate, the forming a package substrate further includes: forming a spacer layer on the second base substrate. The formed spacer layer is located between the graphene layer and the protective layer. Further, the spacer layer and the protective layer may also be fabricated simultaneously.

Hereinafter, in the embodiment of the present disclosure, the forming a package substrate, for example, includes the steps of:

Step 201: forming a black matrix film layer on the second base substrate.

It should be noted that the second base substrate can be a transparent glass substrate. For example, the black matrix film layer may be formed on the second base substrate by a patterning process.

Step 202: forming a color film layer on the second base substrate.

For example, the color film layer is formed on the second base substrate having the black matrix film layer formed thereon. The color film layer can be formed by a patterning process.

Step 203: forming a protective layer on the second base substrate.

In one example, the protective layer is further formed on the second base substrate having the black matrix film layer and the color film layer formed thereon. The protective layer is capable of flattening a surface of the substrate. Of course, a spacer layer may be formed above the protective layer. In an example, the spacer layer and the protective layer may be made of the same material and formed simultaneously, and the spacer can be used for alleviating pressure on the display screen.

Figure 7:
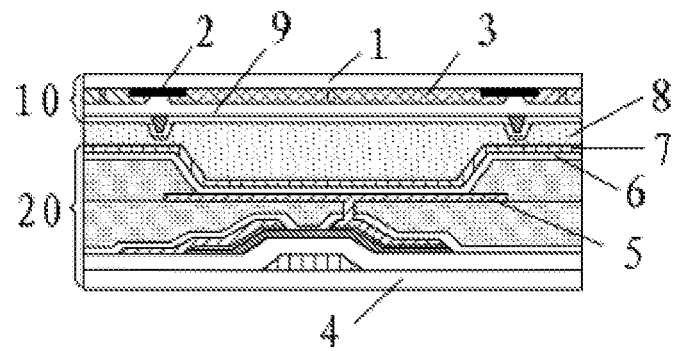
FIG. 7 is a schematic diagram of an OLED display device including the package substrate shown in FIG. 5.
Figure 8:
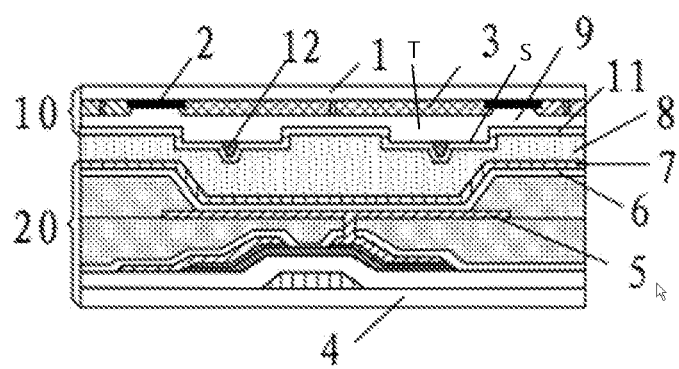
FIG. 8 is a schematic diagram of an OLED display device including the package substrate shown in FIG. 6.

Step 204: forming the graphene layer on the second base substrate,

Finally, the graphene layer is formed on the second base substrate, so that the graphene layer is disposed as the upper most layer of the second base substrate. The package substrate thus formed is shown in FIG. 7. The package substrate shown in FIG. 8 has a patterned protective layer. Each of the projecting portions T has a flat surface S facing to the graphene layer 11. A spacer 12 is disposed on the flat surface S of the projecting portion T.

According to the above description, the embodiments of the present disclosure can at least provide the following structures and methods:

(1) An OLED display device comprising: an array substrate and a package substrate cell-assembled, wherein, the array substrate includes a first base substrate, an anode layer, a cathode layer and an electroluminescent layer disposed between the anode layer and the cathode layer, the anode layer or the cathode layer is disposed as an upper most layer of the array substrate; the package substrate includes a second base substrate and a graphene layer, the graphene layer is disposed as an upper most layer of the package substrate; a conductive filler is provided between the array substrate and package substrate, the graphene layer is electrically connected with the anode layer or the cathode layer disposed as the upper most layer of the array substrate via the conductive filler.

(2) The display device according to (1), wherein the package substrate further comprises a protective layer located between the second base substrate and the graphene layer.

(3) The display device according to (2), wherein the protective layer is formed to have a protective pattern.

(4) The display device according to (2) or (3), wherein the package substrate further comprises a spacer layer disposed between the protective layer and the graphene layer, the spacer layer comprises a plurality of spacers.

(5) The display device according to (4), wherein the spacer layer and the protective layer are made of a same material.

(6) The display device according to (5), wherein the spacer layer and the protective layer are formed at one step.

(7) A fabrication method of an OLED display device, comprising: forming an array substrate; forming a package substrate; and cell-assembling the array substrate and the package substrate; wherein the forming an array substrate comprises forming an anode layer or a cathode layer on a first base substrate, the anode layer or the cathode layer is disposed as an upper most layer of the array substrate; the forming a package substrate comprises forming a graphene layer on a second base substrate, the graphene layer is disposed as an upper most layer of the package substrate; the cell-assembling the array substrate and the package substrate comprises cell-assembling the array substrate and the package substrate by a conductive filler provided between the array substrate and the package substrate, so that the graphene layer is electrically connected with the anode layer or the cathode layer disposed as the upper most layer of the array substrate via the conductive filler.

(8) The fabrication method according to (7), wherein the forming a graphene layer on the second base substrate comprises:

forming a nickel layer with a thickness of 200-500 nm on a third base substrate;

heating the third base substrate having the nickel layer formed thereon in a mixed gas stream of methane, hydrogen and argon at 900-1200° C., and then rapidly cooling the same to a room temperature so as to form a graphene thin film on the nickel layer;

etching off the nickel layer with a solvent, so that the graphene thin film floating on a surface of a solution forms the graphene layer;

transferring the graphene layer to the second base substrate.

(9) The fabrication method according to (8), wherein the transferring the graphene layer to the second base substrate includes:

placing the package substrate in the solution on the surface of which the graphene layer floats, so as to transfer the graphene layer to the second base substrate.

(10) The fabrication method according to (8) or (9), wherein a nickel layer with a thickness of 200-300 nm is formed on the third base substrate, and the third base substrate with the nickel layer is heated in a mixed gas stream of methane, hydrogen and argon at 1000° C.

(11) The fabrication method according to any one of (7) to (10), wherein before the forming a graphene layer on the second base substrate, the forming a package substrate further comprises forming a protective layer on the second base substrate.

(12) The fabrication method according to (11), wherein, before the forming a graphene layer on the second base substrate, and after the forming a protective layer on the second base substrate, the forming a package substrate further comprises forming a spacer layer on the second base substrate.

Although the above text has described the present disclosure in detail by a generic illustration and specific embodiments, yet on the basis of the present disclosure, other modifications or improvements may be made thereto, which is obvious to those skilled in the art. Therefore, these modifications or improvements made without departing from the spirit of the present disclosure all belong to the scope as claimed in the present disclosure.

The present application claims priority of Chinese Patent Application No. 201310513040.1 filed on Oct. 25, 2013, and the above Chinese patent application is incorporated herein by reference in its entirety as part of the present application.

What is claimed is:

1. An OLED display device comprising: an array substrate and a package substrate cell-assembled, wherein, the array substrate includes a first base substrate, an anode layer, a cathode layer and an electroluminescent layer disposed between the anode layer and the cathode layer, the anode layer or the cathode layer is disposed as an upper most layer of the array substrate; the package substrate includes a second base substrate and a graphene layer, the graphene layer is disposed as an upper most layer of the package substrate; a conductive filler is provided between the array substrate and package substrate, the graphene layer is electrically connected with the anode layer or the cathode layer disposed as the upper most layer of the array substrate via the conductive filler, wherein the package substrate further comprises a protective layer located between the second base substrate and the graphene layer, wherein, a surface of the protective layer facing to the graphene layer is continuous and comprises a first flat sub-surface and a second flat sub-surface, the second flat sup-surface is closer to the first base substrate than the first flat sub-surface, a spacer is disposed on the second flat sub-surface, and the spacer is closer to the first base substrate than the first flat sub-surface.

2. The display device according to claim 1, wherein the protective layer is formed to have a protective pattern.

3. The display device according to claim 1, wherein the spacer and the protective layer are made of a same material.

4. The display device according to claim 3, wherein the spacer and the protective layer are formed at one step.

5. A fabrication method of an OLED display device, comprising: forming an array substrate; forming a package substrate; and cell-assembling the array substrate and the package substrate; wherein the forming an array substrate comprises forming an anode layer or a cathode layer on a first base substrate, the anode layer or the cathode layer is disposed as an upper most layer of the array substrate; the forming a package substrate comprises forming a graphene layer on a second base substrate, the graphene layer is disposed as an upper most layer of the package substrate; the cell-assembling the array substrate and the package substrate comprises cell-assembling the array substrate and the package substrate by a conductive filler provided between the array substrate and the package substrate, so that the graphene layer is electrically connected with the anode layer or the cathode layer disposed as the upper most layer of the array substrate via the conductive filler, wherein, the method further comprising forming a protective layer located between the second base substrate and the graphene layer, wherein, a surface of the protective layer facing to the grapheme layer is continuous and comprises a first flat sub-surface and a second flat sub-surface the second flat sub-surface is closer to the first base substrate than the first flat sub-surface, wherein, before the forming a graphene layer on the second base substrate, and after the forming a protective layer on the second base substrate, the forming a package substrate further comprises forming a spacer on the second flat sub-surface, the spacer is closer to the first base substrate than the first flat sub-surface.

6. The fabrication method according to claim 5, wherein the forming a graphene layer on the second base substrate comprises:

forming a nickel layer with a thickness of 200-500 nm on a third base substrate;

heating the third base substrate having the nickel layer formed thereon in a mixed gas stream of methane, hydrogen and argon at 900-1200° C., and then rapidly cooling the same to a room temperature so as to form a graphene thin film on the nickel layer;

etching off the nickel layer with a solvent, so that the graphene thin film floating on a surface of a solution forms the graphene layer;

transferring the graphene layer to the second base substrate.

7. The fabrication method according to claim 6, wherein the transferring the graphene layer to the second base substrate includes:

placing the package substrate in the solution on the surface of which the graphene layer floats, so as to transfer the graphene layer to the second base substrate.

8. The fabrication method according to claim 6, wherein a nickel layer with a thickness of 200-300 nm is formed on the third base substrate, and the third base substrate with the nickel layer is heated in a mixed gas stream of methane, hydrogen and argon at 1000° C.

9. The fabrication method according to claim 5, wherein before the forming a graphene layer on the second base substrate, the forming a package substrate comprises forming the protective layer on the second base substrate.

10. The fabrication method according to claim 5, wherein the spacer and the protective layer are made of a same material.

11. The fabrication method according to claim 10, wherein the spacer and the protective layer are formed at one step.

12. The fabrication method according to claim 7, wherein a nickel layer with a thickness of 200-300 nm is formed on the third base substrate, and the third base substrate with the nickel layer is heated in a mixed gas stream of methane, hydrogen and argon at 1000° C.

13. The fabrication method according to claim 6, wherein before the forming a graphene layer on the second base substrate, the forming a package substrate further comprises forming a protective layer on the second base substrate.

14. The fabrication method according to claim 7, wherein before the forming a graphene layer on the second base substrate, the forming a package substrate further comprises forming a protective layer on the second base substrate.

15. The fabrication method according to claim 8, wherein before the forming a graphene layer on the second base substrate, the forming a package substrate further comprises forming a protective layer on the second base substrate.

16. The fabrication method according to claim 12, wherein before the forming a graphene layer on the second base substrate, the forming a package substrate further comprises forming a protective layer on the second base substrate.

17. The display device according to claim 1, wherein, the graphene layer is conformally formed on the surface of the protective layer and the spacer.

* * * * *